United States Patent [19]
Hung et al.

[11] Patent Number: 6,071,823
[45] Date of Patent: Jun. 6, 2000

[54] DEEP TRENCH BOTTLE-SHAPED ETCH IN CENTURA MARK II NG

[75] Inventors: Lin Ming Hung; Nien-Yu Tsai; Pao-Chu Chang; Ray Lee, all of Hsinchu, Taiwan

[73] Assignees: ProMos Technology, Inc; Mosel Vitelic Inc, both of Hsinchu, Taiwan; Siemens AG, Munich, Germany

[21] Appl. No.: 09/399,825

[22] Filed: Sep. 21, 1999

[51] Int. Cl.$^7$ .................. H01L 21/8242; H01L 21/20; H01L 21/461

[52] U.S. Cl. .................. 438/714; 438/243; 438/386; 438/735; 438/734; 438/713; 438/706; 216/67; 216/72

[58] Field of Search .................. 438/734, 733, 438/735, 737, 739, 386, 387, 243, 424, 427, 714, 706, 707, 710, 711, 712, 713; 216/63, 72, 67

[56] References Cited

U.S. PATENT DOCUMENTS 5,605,600  2/1997  Muller et al. .................. 156/643.1
5,891,807  4/1999  Muller .................. 438/713

*Primary Examiner*—Charles Bowers
*Assistant Examiner*—Thanhha S Pham
*Attorney, Agent, or Firm*—W. Wayne Liauh

[57] ABSTRACT

A method to fabricate bottle-shaped deep trench in a semiconductor substrate which mainly involves two substitute plasma etching steps from the conventional approach. After a neck profile is formed, instead of raising the plasma gas pressure while keeping the etching composition constant, as in the conventional approach, the plasma gas pressure is first maintained the same, then decreased substantially. On the other hand, the concentrations of HBr and $NF_3$ are increased substantially in both new steps. The first substitute plasma etching step is conducted at a pressure of 100 mtorr an RF power of about 1,000 W, a magnetic field of 65 Gauss. The plasma gas composition consists of HBr, $NF_3$, and ($He/O_2$) a at a ratio of about 200:20:20. The second substitute plasma etching step is conducted at plasma gas pressure of 30 mtorr, an RF power of 600 W, a magnetic field of 65 Gauss. The plasma gas composition consists of HBr, $NF_3$, and ($He/O_2$) a at a ratio of about 150:13:20.

16 Claims, 3 Drawing Sheets

DEEP TRENCH BOTTLE-SHAPED ETCH IN CENTURA MARK II NG

FIELD OF THE INVENTION

The present invention relates to an improved method for making sub-micron-sized semiconductor devices containing at least one deep-trench type capacitor. More specifically, the present invention relates to a method for fabricating into a semiconductor substrate one or more bottle-shaped deep trenches with an enlarged diameter, or more generally speaking, with enlarged circumference or cross-sectional area, at the lower portion thereof, so as to increase the surface area and thus the capacitance of the capacitor that is formed around the side wall of the deep trench. Unlike prior art techniques, the method disclosed in the present invention does not require the formation of a collar oxide nor the additional thermal oxidation step in order to form an oxide layer laterally into the substrate.

BACKGROUND OF THE INVENTION

There are two basic types of capacitors provided in a semiconductor device, the crown-type capacitors and the deep-trench type capacitors. A capacitor comprises a dielectric layer sandwiched by a pair of spaced conducting plates. As the trend in the fabrication of semiconductor devices is toward ever-increasing density of circuit components that can be tightly packed per unit area, there are great demands to develop technologies that can reduce the surface area to be taken by individual circuit components. As a result, deep trench technologies have been developed which result in structures, particularly large area capacitors, that are vertically oriented with respect to the plane of the substrate surface.

A deep trench capacitor typically comprises a dielectric layer formed on the sidewalls of a deep trench, which is formed into and surrounded by a highly doped buried plate (which constitutes the first conducting plate), and a highly doped poly fill (which constitutes the second conducting plate), which fills the deep trench. The capacitance of the deep trench capacitor is determined by the total sidewall surface of the trench, which, in turn, is determined by the diameter, or more specifically the circumference, of the deep trench. As the semiconductor fabricating technology moves into the sub-micron or even deep sub-micron range, it is increasingly recognized that the present technology for making deep trench capacitors may be inadequate. For deep sub-micron semiconductor devices, a deep trench can have a length-to-diameter aspect ratio of 35:1 or even greater. With current technology, the diameter (or width or circumference) of the trench generally decreases with depth. Such a tapered cross-sectional area causes a significant decrease in the overall sidewall surface of the trench, and, consequently, the capacitance provided by the deep trench capacitor. This problem is expected to become even more profound as we move into the next generation of ULSI fabrication technologies that are characterized with critical dimensions of 0.15-micron or even finer.

To increase the capacitance of a semiconductor deep-trench capacitor, the so-called bottle-shaped deep trench has been proposed. In an article entitled "0.228 $\mu$m Trench Cell Technologies with Bottle-Shaped Capacitor for 1 Gbit DRAMs", by T. Ozaki, et al, *IEDM*, 95, PP661–664 (1995), the authors disclosed a method to increase the diameter of a deep trench. The method disclosed therein includes the steps of: (1) forming an 80 nm collar oxide at the upper portion of the trench by the selective oxidation; (2) performing a capacitor process which includes oxidation mask removal, native oxide removal, etc., during which process the collar oxide thickness reduces to 50 nm; and (3) in-situ phosphorous doped polysilicon is deposited and phosphorous doping into the trench side wall at the capacitor portion (plate electrode) is performed by the furnace annealing technology. The collar oxide prevents phosphorous doping at the upper portion of the trench; it also makes the electrical isolation between the plate electrode and the transfer transistor. The poly-silicon is removed by chemical dry etching and the diameter of the trench under the collar oxide is enlarged at the same time.

Since the method disclosed in Ozaki et al requires the additional steps of first forming a collar oxide followed by thermal oxidation of the substrate in the lower portion of the deep trench, it can substantially increase the manufacturing cost.

SUMMARY OF THE INVENTION

The primary object of the present invention is to develop an improved method for making deep sub-micron deep trench type capacitors with an enhanced sidewall surface so that a capacitance of 40 pF or more can be attained, without substantially increasing the manufacturing cost. More specifically, the primary object of the present invention is to develop a method for enlarging the sidewall surface of a deep trench capacitor, by forming a bottle-shaped deep trench in the substrate, without substantially deviating from the conventional process, so as to obtain the maximum benefit under a controlled manufacturing cost. The present invention also relates to the semiconductors that are made from a process incorporating this method.

Conventionally, deep trenches are formed into a substrate by an anisotropic plasma etching process using a plasma gas composition that comprises hydrogen bromide (HBr), nitrogen fluoride ($NF_3$), helium, and oxygen, at a predetermined ratio. In order to minimize the disparity in the trench width (i.e., diameter) from top to bottom, as well as not to substantially increase the width in the upper portion of the trench, the pressure of the plasma composition is increased midway during the anisotropic etching process, while maintaining the concentration of HBr and $NF_3$ constant. The underlying consideration for the conventional approach is to minimize the width degradation in forming a submicron deep trench; it was not considered to be possible to the use the same approach, even in a modified form, to fabricated bottle-shaped deep trenches.

In the present invention, it was discovered that the conventional approach can indeed be modified so that a bottle-shaped trench can be formed. The method disclosed in the present invention involves two substitute steps. First, the trench being formed is subject to a "shock" treatment at substantially increased concentrations of HBr and $NF_3$ (as opposed to constant HBr and $NF_3$ concentrations in the conventional process), but at about the same plasma pressure for a short duration. Then the concentrations of HBr and $NF_3$ are cut back, but the plasma pressure is substantially reduced (as opposed to substantially increased plasma gas pressure), in a subsequent substitute step. The second substitute step continues until the etching process is completed. One of the main advantages of the present invention is that a bottle-shaped deep trench can be formed with the same equipment and plasma etching components as the conventional method, thus eliminating the need for capital investments as well as other extra operational expenses that may be otherwise required.

BRIEF DESCRIPTION OF THE DRAWING

The present invention will be described in detail with reference to the drawing showing the preferred embodiment of the present invention, wherein:

FIG. 1 is a schematic drawing showing that a pad stacked dielectric layer and a photoresist pattern are formed on a substrate.

FIG. 2 is a schematic drawing showing that an opening is formed through the pad stacked layer by reactive ion etching or plasma etching techniques utilizing the photoresist layer.

FIG. 3 is a schematic drawing showing that a neck profile is formed in the substrate by subjecting the substrate to a second plasma etching process.

FIG. 4 is a schematic drawing showing that the slope of trench width decrease is substantially ameliorated by switching to a third plasma etching process at higher plasma gas pressure but the same plasma etching composition.

DETAILED DESCRIPTION OF THE PREFERRED EMBODIMENT

The present invention discloses a method for making deep sub-micron deep trench type capacitors with a bottle-shaped enhanced sidewall surface so that a capacitance of 40 pF or more can be attained. One of the main advantages of the present invention is that the bottle-shaped deep trench can be formed with the same equipment, same plasma components, and similar procedure, as the conventional method, thus eliminating the need for capital investments that may be otherwise required.

Conventionally, deep trenches are formed into a substrate by an anisotropic plasma etching process using a plasma gas composition that comprises hydrogen bromide (HBr), nitrogen fluoride ($NF_3$), helium, and oxygen, at a predetermined composition. In order to minimize the disparity in the trench width (i.e., diameter) from top to bottom, as well as not to substantially increase the width in the upper portion of the trench, the pressure of the plasma composition is increased midway during the anisotropic etching process, while the concentrations of HBr and $NF_3$ constant are maintained constant. A high plasma pressure increases the horizon etching rate relative to vertical etching rate, while the effect of the plasma etch on the already formed sidewall is minimized by maintaining the concentrations of HBr and $NF_3$ relatively constant. The main design consideration of the conventional approach is to contain the width degradation in the deep trench, it was not considered to be possible to form a bottle-shaped deep trench.

Figure 1:
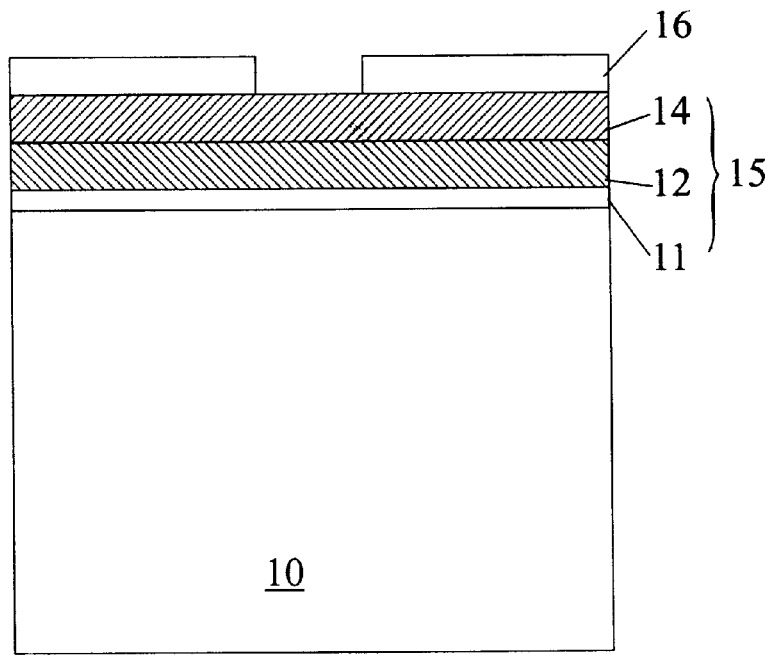
FIGS. 1 through 4 are schematic drawings showing the main steps in forming a deep trench according to an approach which is similar to the conventional approach.

FIGS. 1 through 4 are schematic drawings showing the main steps in forming a deep trench according to an approach that is similar to the conventional approach. In FIG. 1, it is shown that a pad stacked layer 15 is formed on a substrate 10. The pad stacked layer 15 typically consists of a pad oxide layer 11, a silicon nitride layer 12, and a dielectric boron silicate glass layer 14. The pad oxide layer 11 is provided mainly to improve the adhesion between the nitride layer and the silicon substrate, and to reduce thermal and mechanical stresses. FIG. 1 also shows a photoresist pattern 16 which is formed by a photolithography process.

Figure 2:
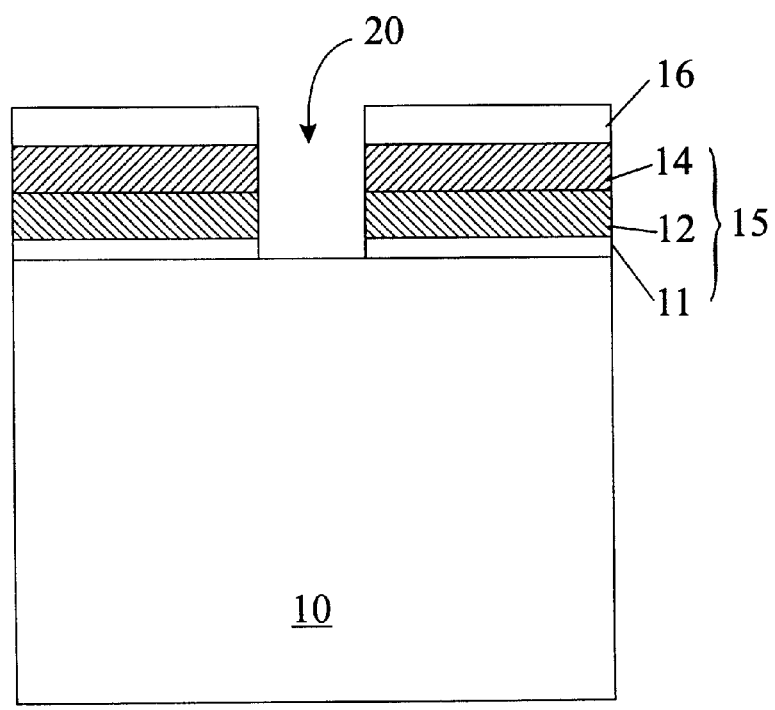

FIG. 2 shows that an opening 20 is formed through the pad stacked layer 15, by reactive ion etching or plasma etching techniques, utilizing the photoresist layer 16. After the photoresist layer is removed, the substrate is subject to a first plasma etching to remove a native oxide layer which may be formed due to the exposure of the silicon substrate to the outside environment. The first plasma etching, which is often called a "breakthrough" step, is conducted at a plasma gas pressure of about 20 to 50 mtorr, preferably 25 mtorr; an RF power of about 500 to 900 W, preferably at 600 W; and a magnetic field of about 10 to 40 Gauss, preferably at 15 Gauss. The plasma gas composition consists of HBr and $NF_3$ a at a ratio of about 20:5, expressed in terms of volumetric flow rate, sccm (standard cubic centimeters). The etching time is about 20 to 40 seconds, preferably 25 seconds. This step is described as the first plasma etching.

Figure 3:
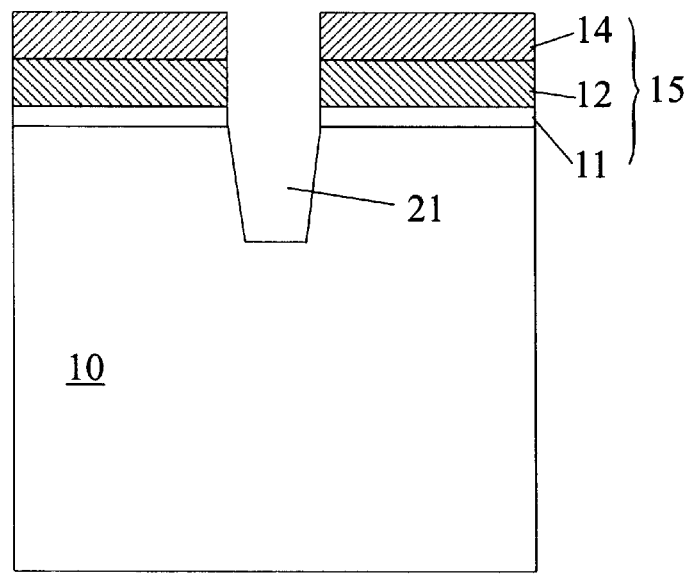

FIG. 3 shows that a neck profile is formed in the substrate by subjecting the substrate to a subsequent plasma etching process. The second plasma etching is conducted at a plasma gas pressure of about 80 to 110 mtorr, preferably 100 mtorr; an RF power of about 700 to 900 W, preferably at 800 W; and a magnetic field of about 80 to 110 Gauss, preferably at 100 Gauss. The plasma gas composition consists of HBr, $NF_3$, and ($He/O_2$) a at a ratio of about 87:13:35. The ratio between He and $O_2$ is about 70%:30% in the ($He/O_2$) mixture. The etching time is about 90 to 110 seconds, preferably 95 seconds. FIG. 3 shows a tapered neck profile, which constitutes the upper portion of the deep trench 21. This step is described as the second plasma etching.

Figure 4:
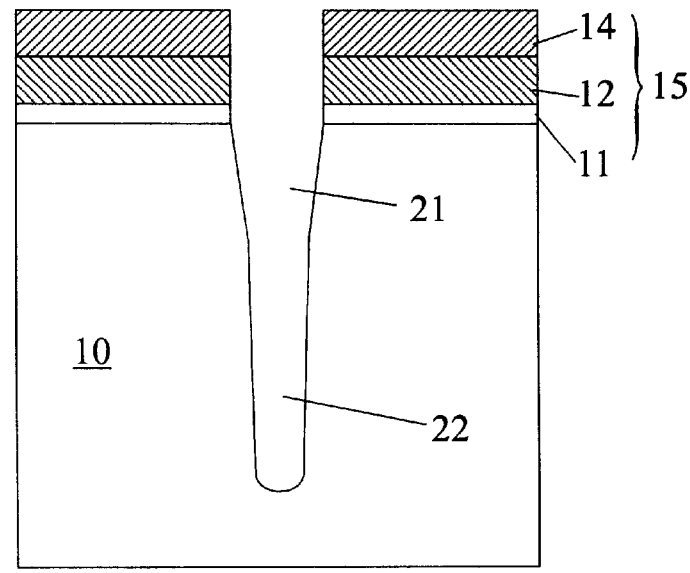

In order to arrest the sharp degradation in the width of the trench as the plasma etching further progresses, the prior art approach calls for an increase in the plasma gas pressure from between 80 to 110 mtorr, to about 110 to 130 mtorr, preferably at 125 mtorr, while maintaining other conditions, including the plasma etching gas composition, substantially the same. The etching time is about 450 to 500 seconds, preferably 485 seconds. The result is shown in FIG. 4, which indicates that the slope of trench width decrease is substantially ameliorated. However, the width of the entire lower portion 22 of the trench is narrower than the narrowest width in the upper portion. This step is described as the third plasma etching.

With the method disclosed in the present invention, which involves a two-step process to replace the third plasma etching step of the conventional process, the trench is first subject to the first and second substitute plasma etching steps as in the conventional approach. Thereafter, instead of going through the third plasma etching step, a "shock" treatment at substantially increased concentrations of HBr and $NF_3$, but at about the same plasma pressure as the previous (i.e., second) plasma etching step, is performed for a relatively short duration compared to the third plasma etching step of the conventional approach. This is called the first substitute etching step. Then the concentrations of HBr and $NF_3$ are cut back, and the plasma pressure is substantially reduced during the second substitute plasma etching step. The second substitute plasma etching step continues until the etching process is completed.

In the first substitute plasma etching step, the etching is conducted at a plasma gas pressure of about 80 to 110 mtorr, preferably 100 mtorr; an RF power of about 600 to 1,000 W, preferably at 1,000 W; and a magnetic field of about 55 to 75 Gauss, preferably at 65 Gauss. The plasma gas composition consists of HBr, $NF_3$, and $He/O_2$ (i.e., mixture of He and $O_2$) at a ratio of about 200:20:20. The ratio between He and $O_2$ is the same at about 70%:30%. The etching time is about 180 to 220 seconds, preferably 200 seconds.

Thereafter, the trench is subjected to the second substitute plasma etching step, which is conducted at a substantially lowered plasma gas pressure of about 20 to 50 mtorr, preferably 30 mtorr; an RF power of about 600 to 1,000 W, preferably at 600 W; and a magnetic field of about 55 to 75 Gauss, preferably at 65 Gauss. The plasma gas composition consists of HBr, $NF_3$, and (He/$O_2$) a at a ratio of about 150:13:20. The ratio between He and $O_2$ is changed to about 10%:1%. The etching time is about 270 to 320 seconds, preferably 300 seconds.

As discussed above, one of the main advantages of the present invention is that a bottle-shaped deep trench can be formed with the same equipment and plasma components as the conventional method, thus eliminating the need for capital investments that may be otherwise required.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A pad stacked layer 15, which consists of a pad oxide layer 11, a silicon nitride layer 12, and a dielectric boron silicate glass layer 14 is formed on a substrate 10, as shown in FIG. 1, via chemical vapor deposition. A photoresist pattern 16 is then formed by a photolithography process on the pad stacked layer 15.

An opening 20 is formed through the pad stacked layer 15, by plasma etching technique, utilizing the photoresist layer 16, as shown in FIG. 2. After the photoresist layer is removed, the substrate is subject to a first (or breakthrough) plasma etching to remove a native oxide layer which may be formed due to the exposure of the silicon substrate to the outside environment. The first plasma etching process is conducted at a plasma gas pressure of 25 mtorr, an RF power of 600 W, and a magnetic field of 15 Gauss. The plasma gas composition consists of HBr and $NF_3$ a at a ratio of about 20:5. The numbers in the ratio indicate the gas flow rates, in sccm. The etching time is 25 seconds.

The substrate is then subjected to a second plasma etching step to form a neck profile 21 as shown in FIG. 3. The second plasma etching is conducted at a plasma gas pressure of 100 mtorr, an RF power of 800 W, and a magnetic field of 100 Gauss. The plasma gas composition consists of HBr, $NF_3$, and (He/$O_2$) a at a ratio of about 87:13:35. The ratio between He and $O_2$ is about 70%:30%. The etching time is 95 seconds.

Figure 5:
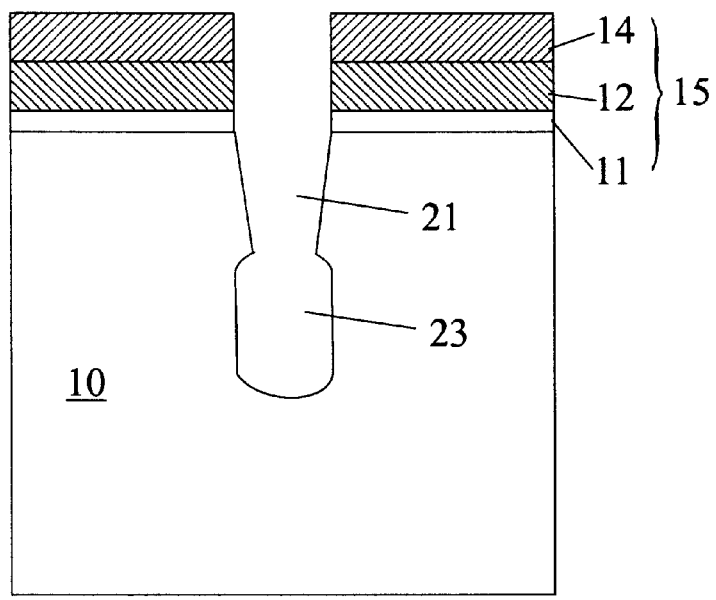
FIG. 5 is a schematic drawing showing that a bottle-shaped trench is initially formed using a first substitute plasma etching process after the second plasma etching step.

During the subsequent plasma etching step to form the lower portion of the trench, instead of raising the plasma gas pressure while keeping the etching composition constant, the plasma gas pressure is first maintained the same, then decreased substantially. On the other hand, the concentrations of HBr and $NF_3$ are increased substantially in both steps. The first substitute plasma etching step is conducted at a pressure of 100 mtorr an RF power of about 1,000 W, and a magnetic field of 65 Gauss. The plasma gas composition consists of HBr, $NF_3$, and (He/$O_2$) a at a ratio of about 200:20:20. The ratio between He and $O_2$ in the (He/$O_2$) mixture is the same at about 70%:30%. The etching time is 200 seconds. FIG. 5 shows that the width increases in the lower portion 23 of the trench 30.

Figure 6:
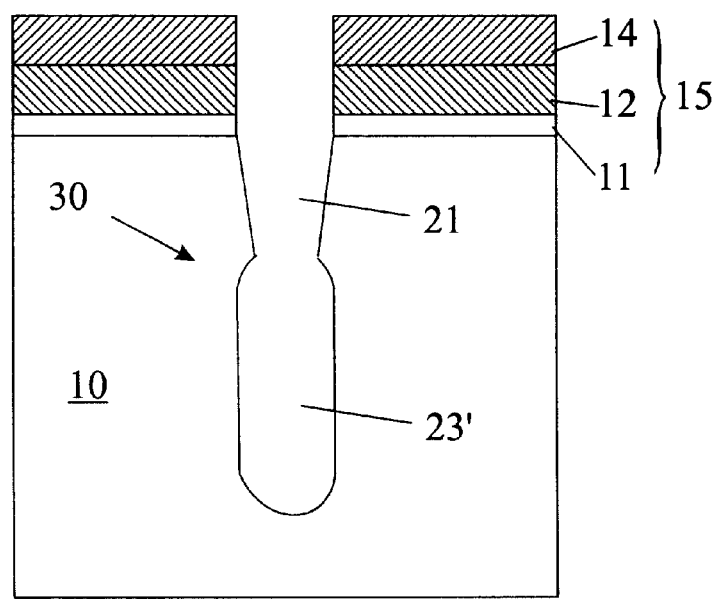
FIG. 6 is a schematic drawing showing that the increased width is maintained throughout the lower portion of the trench using first substitute plasma etching process.

The second substitute plasma etching step is conducted at plasma gas pressure of 30 mtorr, an RF power of 600 W, and a magnetic field of 65 Gauss. The plasma gas composition consists of HBr, $NF_3$, and (He/$O_2$) at a ratio of about 150:13:20. The ratio between He and $O_2$ is 70%:30%. The etching time is 300 seconds. FIG. 6 shows that the increased width maintained throughout the lower portion 23' of the trench.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a deep trench in a semiconductor substrate, comprising the steps of:
   (a) forming a pad stacked layer on a substrate, said pad stacked layer comprises a nitride layer and a dielectric glass layer;
   (b) forming a through hole in said pad stacked layer using a photolithography process;
   (c) performing a second plasma etching process to form an upper trench section in said substrate, said second plasma etching process being performed at a second plasma gas pressure using a second etching composition which comprises HBr, $NF_3$ and a mixture of He and $O_2$ at a second set of flow rates;
   (d) performing a first substitute plasma etching process to form an width-enlarged trench section in said substrate, said first substitute plasma etching process being performed at substantially the same plasma gas pressure but a substantially higher flow rate of HBr relative to said second plasma etching process; and
   (e) performing a second substitute plasma etching process to extend said width-enlarged trench section further into said substrate, said second substitute plasma etching process being performed at a substantially reduced plasma pressure and a slightly reduced flow rate of HBr relative to said first substitute plasma etching process.

2. The method for forming a deep trench in a semiconductor substrate according to claim 1 wherein said HBr flow rate in said first substitute plasma etching process is at least about 100% greater than that in said second plasma etching process.

3. The method for forming a deep trench in a semiconductor substrate according to claim 1 wherein said plasma gas pressure in said second substitute plasma etching process is at least about 50% lower than that in said first substitute plasma etching process.

4. The method for forming a deep trench in a semiconductor substrate according to claim 1 wherein said $NF_3$ flow rate in said first substitute plasma etching process is also substantially greater than that in said second plasma etching process.

5. The method for forming a deep trench in a semiconductor substrate according to claim 1 wherein said $NF_3$ flow rate in said first substitute plasma etching process is at least 100% greater than that in said second plasma etching process.

6. The method for forming a deep trench in a semiconductor substrate according to claim 1 wherein said He and $O_2$ are maintained at a flow rate ratio of about 70 mol %:30 mol %.

7. The method for forming a deep trench in a semiconductor substrate according to claim 1 which further comprises a first plasma etching process prior to said second plasma etching process to remove a native oxide layer that may be formed when said through hole is formed.

8. The method for forming a deep trench in a semiconductor substrate according to claim 1 wherein said HBr flow rate in said second substitute plasma etching process is about 50% to 75% greater than that in said second plasma etching process.

9. A method for forming a semiconductor device on a semiconductor substrate, said semiconductor containing a deep trench formed into said semiconductor substrate, and said method comprising the steps of:

(a) forming a pad stacked layer on a substrate, said pad stacked layer comprises a nitride layer and a dielectric glass layer;

(b) forming a through hole in said pad stacked layer using a photolithography process;

(c) performing a second plasma etching process to form an upper trench section in said substrate, said second plasma etching process being performed at a second plasma gas pressure using a second etching composition which comprises HBr, $NF_3$ and a mixture of He and $O_2$ at a second set of flow rates;

(d) performing a first substitute plasma etching process to form an width-enlarged trench section in said substrate, said first substitute plasma etching process being performed at substantially the same plasma gas pressure but a substantially higher flow rate of HBr relative to said second plasma etching process; and (e) performing a second substitute plasma etching process to extend said width-enlarged trench section further into said substrate, said second substitute plasma etching process being performed at a substantially reduced plasma pressure and a slightly reduced flow rate of HBr relative to said first substitute plasma etching process.

10. The method for forming a semiconductor device on a semiconductor substrate according to claim 9 wherein said HBr flow rate in said first substitute plasma etching process is at least about 100% greater than that in said second plasma etching process.

11. The method for forming a semiconductor device on a semiconductor substrate according to claim 9 wherein said plasma gas pressure in said second substitute plasma etching process is at least about 50% lower than that in said first substitute plasma etching process.

12. The method for forming a semiconductor device on a semiconductor substrate according to claim 9 wherein said $NF_3$ flow rate in said first substitute plasma etching process is also substantially greater than that in said second plasma etching process.

13. The method for forming a semiconductor device on a semiconductor substrate according to claim 9 wherein said $NF_3$ flow rate in said first substitute plasma etching process is at least 100% greater than that in said second plasma etching process.

14. The method for forming a semiconductor device on a semiconductor substrate according to claim 9 wherein said He and $O_2$ are maintained at a flow rate ratio of about 70 mol %:30 mol %.

15. The method for forming a semiconductor device on a semiconductor substrate according to claim 9 which further comprises a first plasma etching process prior to said second plasma etching process to remove a native oxide layer that may be formed when said through hole is formed.

16. The method for forming a semiconductor device on a semiconductor substrate according to claim 9 wherein said HBr flow rate in said second substitute plasma etching process is about 50% to 75% greater than that in said second plasma etching process.

* * * * *